(12) United States Patent
Hasegawa et al.

(10) Patent No.: US 9,059,407 B2
(45) Date of Patent: Jun. 16, 2015

(54) METHOD FOR MANUFACTURING ORGANIC SEMICONDUCTOR THIN FILM AND MONOCRYASTALLINE ORGANIC SEMICONDUCTOR THIN FILM

(75) Inventors: Tatsuo Hasegawa, Ibaraki (JP); Hiromi Minemawari, Ibaraki (JP); Toshikazu Yamada, Ibaraki (JP); Hiroyuki Matsui, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 13/816,999

(22) PCT Filed: Aug. 10, 2011

(86) PCT No.: PCT/JP2011/068294
§ 371 (c)(1),
(2), (4) Date: Feb. 14, 2013

(87) PCT Pub. No.: WO2012/023476
PCT Pub. Date: Feb. 23, 2012

(65) Prior Publication Data
US 2013/0149811 A1    Jun. 13, 2013

(30) Foreign Application Priority Data

Aug. 18, 2010  (JP) ................................. 2010-182945
Aug. 26, 2010  (JP) ................................. 2010-189315

(51) Int. Cl.
*H01L 51/40* (2006.01)
*H01L 51/00* (2006.01)
(Continued)

(52) U.S. Cl.
CPC ........ *H01L 51/0002* (2013.01); *H01L 51/0005* (2013.01); *H01L 51/0094* (2013.01); *H01L 51/0007* (2013.01); *C09D 11/322* (2013.01); *C09D 11/52* (2013.01)

(58) Field of Classification Search
None
See application file for complete search history.

(56) References Cited

U.S. PATENT DOCUMENTS 6,994,893 B2 *   2/2006  Spreitzer et al. .............. 427/469
8,585,454 B2 *  11/2013  Cha et al. ........................ 445/23
(Continued)

FOREIGN PATENT DOCUMENTS

EP       2 190 007 A1    5/2010
JP       2005-64122 A    3/2005
(Continued)

OTHER PUBLICATIONS

Article entitled "High-Performance Polymer-Small Molecule Blend Organic Transistors" by Richard Hamilton et al.2009 Advanced Material, vol. 21; pp. 1166-1171.
(Continued)

*Primary Examiner* — Scott B Geyer
(74) *Attorney, Agent, or Firm* — McCormick, Paulding & Huber LLP

(57) ABSTRACT

A method for manufacturing a uniform organic semiconductor thin film consisting of single organic molecule with extremely few pinholes and of which both quality and thickness are uniform when the organic semiconductor thin film is manufactured by printing process. The uniform organic semiconductor thin film is manufactured by steps of: preparing a first ink obtained by dissolving a high concentration of the organic semiconductor in an organic solvent with high affinity for the organic semiconductor, and a second ink consisting of an organic solvent having a low affinity for the organic semiconductor; mixing the first and second inks on a substrate by simultaneously or alternately discharging the first and second inks from each ink head.

9 Claims, 4 Drawing Sheets

(51) Int. Cl.
*C09D 11/322* (2014.01)
*C09D 11/52* (2014.01)

(56) References Cited

U.S. PATENT DOCUMENTS

| | | | |
|---|---|---|---|
| 2005/0067949 A1* | 3/2005 | Natarajan et al. | 313/504 |
| 2006/0001021 A1* | 1/2006 | Adewole et al. | 257/40 |
| 2006/0024859 A1* | 2/2006 | Wu et al. | 438/99 |
| 2007/0072394 A1 | 3/2007 | Shimizu et al. | |
| 2007/0117298 A1 | 5/2007 | Fujimori et al. | |
| 2007/0153371 A1* | 7/2007 | Cha et al. | 359/373 |
| 2011/0180787 A1* | 7/2011 | Cho et al. | 257/40 |

FOREIGN PATENT DOCUMENTS

| | | |
|---|---|---|
| JP | 2005-518332 A | 6/2005 |
| JP | 2007-142305 A | 6/2007 |
| JP | 2007-305807 A | 11/2007 |
| JP | 2008-153318 A | 7/2008 |
| JP | 2008-198992 A | 8/2008 |
| JP | 2010-123778 A | 6/2010 |
| JP | 2010-212587 A | 9/2010 |
| WO | 03/074619 A1 | 9/2003 |

OTHER PUBLICATIONS

Article entitled "Self-Organizatin of Ink-jet-Printed Triisopropylsilylethynyl Pentacene via Evaporation-Induced Flows in a Drying Droplet" by Jung Ah Lim, Advanced Functional Materials, 2008; pp. 229-234.
Article entitled "Organic field-effect transistors using single crystals" by Tatsuo Hasegawa, et al. Sci. Technol. Adv. Mater. 10 (2009) cover sheet and pp. 1-16.
Article entitled "Patterning organic single-crystal transistor arrays"; vol. 444; Dec. 14, 2006; doi:10.1038/nature05427; pp. 913 to 917.
Article entitled "Very High Mobility in Solution-Processed Organic Thin-Film Transistors of Highly Ordered [1] Benzothieno[3,2-b]benzothiophene Derivaties" by Takafumi Uemura et al.; The Japan Society of Applied Physics Express 2 (2009) pp. 111501-1 to 111501-3.
PCT Search Report for PCT Serial No. PCT/JP2011/068294 dated Sep. 13, 2011.
Article entitled "Growth and characterisation of centimetre-sized single crystals of molecular organic materials" by M. Campione et al. 2005 Journal of Materials Chemistry, vol. 15; No. 25, pp. 2437-2443.
Article entitled "Wetting-Dewetting Oscillations of Liquid Films during Solution-Mediated Vacuum Deposition of Rubrene" by Yui Ishii et al. 2007, Langmuir, American Chemical Society, vol. 23; No. 12, pp. 6864-6868.
Article entitled "High mobility solution processed 6, 13-bis(triisopropyl-silylethynyl) pentacene organic thin film transistors" by Sung Kyu Park et al. 2007, Applied Physics Letters, American Institute of Physics, vol. 19; No. 6, 3 pp. 2437-2443.
Supplementary European Search Report for Application Serial No. EP 11 81 8118 dated Dec. 4, 2013.
Chinese Office Action for Application Serial No. 201180039763.1 dated Jan. 20, 2015.

\* cited by examiner

METHOD FOR MANUFACTURING ORGANIC SEMICONDUCTOR THIN FILM AND MONOCRYASTALLINE ORGANIC SEMICONDUCTOR THIN FILM

CROSS-REFERENCE TO RELATED APPLICATION

The present application claims priority from International Patent Application Serial No. PCT/JP2011/068294 filed Aug. 10, 2011; Japanese Patent Applications Nos. JP2010-182945 filed on Aug. 18, 2010 and No. 2010-189315 filed on Aug. 26 2010, the contents of which are hereby incorporated by reference into this application.

TECHNICAL FIELD OF THE INVENTION

The present invention relates to method for manufacturing an organic semiconductor thin film and a monocrystalline organic semiconductor thin film.

BACKGROUND OF THE INVENTION

Organic electronics using organic semiconductors of both high molecular and low molecular have noticed as a major next-generation technology for manufacturing flat panel displays and electronic paper. Recently, it has been highly progressed that an organic electric field light emission diode having been manufactured as a commercial reality and researches and developments for an organic semiconductor thin film electric field effect transistor for applying to an active-matrix-use switching element.

One of the features of the organic electronics is that it is possible to manufacture an electronic device by solution process without vacuum state and printing technique improved from the process. Compared with a conventional inorganic-based semiconductor device requiring high costs for a large-scale vacuum device, a high-temperature device, etc., due to manufacturing a product with larger size, it has been expected to be able to manufacture a flat panel display and electronic paper with a large area by reduced energy and low costs.

As technique constructing an organic semiconductor thin film by printing technique, an organic semiconductor of high molecular system of which the viscosity in a solution tends to increase has been researched. In contrast, an organic semiconductor of low molecular system obtaining higher device property compared with high molecular system is difficult to form a uniform semiconductor layer due to a low viscosity of a solution and a highly crystalline property possessed by the low molecular organic semiconductor.

As potent printing technique using an ink with relatively low viscosity, an ink jet printing method has been proposed (see JP Publication 2005-518332). The method for manufacturing an organic semiconductor thin film by the ink jet printing method comprises steps of dropping a solution (ink) dissolving a high concentration of an organic semiconductor in an organic solvent or the like onto a substrate from an ink head and depositing an organic semiconductor layer by the succeeding evaporation of the organic solvent. However, in this method, since the deposition of the organic semiconductor proceeds with generation of convection inside the droplet after dropping the ink, the deposition of the material is concentrated on the peripheral portion of the droplet where the solvent is mainly evaporated. The obtained thin film is only thin because a film thickness of the peripheral portion of the obtained film is very thick.

To improve the film forming property, method for suppressing the convection inside the droplet by mixing a soluble polymer such as poly(α-methylstyrene) or the like in the solution has been proposed (see Advanced Materials Vol. 21 p. 1166, 2009). It is shown that, since the solvent evaporation rate reduces by the effect of a high molecular matrix, it is effective because a larger microcrystal grain grown can be obtained.

Moreover, an attempt to improve the uniformity of the film thickness of the organic semiconductor layer by controlling the convection inside the droplet by mixing a different organic solvent has been reported (see Advanced Materials Vol. 18 p. 229, 2008). However, the method is not sufficient in terms that the property deteriorates because the polymer unrelated the conductivity is mixed with the low molecular organic semiconductor and of controllability, uniformity, etc. of the entire film formation obtained by dropping.

On the other hand, as an ink jet printing method for a low molecular organic material, a double shot-ink jet printing method using a molecular compound-based conductive organic material consisting of two kinds of molecules which are electron donating molecules and electron accepting molecules has been proposed (see JP Publication 2007-305807 and JP Publication 2008-153318). This method comprises the steps: preparing an ink obtained by dissolving a high concentration of the electron donating molecules and an ink obtained by dissolving a high concentration of the electron accepting molecules separately; mixing the inks from each ink head respectively discharging at the same position of a substrate; and mixing them applying onto the same position on the substrate to form a molecule compound thin film on the substrate. This method is reported that since the solubility of the molecule compound is extremely lower than the solubility of each molecule and the molecule compound is deposited prior to evaporation of the organic solvent, a thin film with high uniformity of film quality and film thickness can be obtained.

However, the above methods are limited in case in which in the molecule compound consisting of two kinds of molecules, a great difference in solubility between the material molecules and the compound can be utilized. Since low molecular organic semiconductors obtaining high device property is mostly organic materials consisting of single component organic molecules, the above-mentioned ink jet printing method cannot be applied to it.

Incidentally, in the organic semiconductor device, an organic semiconductor layer of a core layer for device operations applies an amorphous thin film with ruleless molecular arrangement or a polycrystalline thin film consisting of microcrystals of which molecules are regularly arranged with a size of several micrometers or less. Moreover, many researches on a monocrystal device using a monocrystal with a size of several hundred micrometers or more as a prototype device to search a carrier transfer state inside an organic semiconductor layer have been conducted. It has been reported that since the monocrystal device does not have grain boundary which is one of causes intervening with the carrier transfer and the regularity of a molecular arrangement is on the entire area of the semiconductor, a superior carrier transfer property can be obtained (see Science and Technology of Advanced Functional Materials, Vol. 10 p. 024314, 2009).

Moreover, recently, researches that a monocrystal device with superior property is configured on a substrate using a processing technique to effectively utilize as a practical device have been developed.

For example, Nature, Vol. 444, p. 913, 2006 proposed method for growing an organic semiconductor monocrystal only on a treated area by the vapor phase method, wherein the treated area is on a surface treated with a silane coupling agent by octadecyl triethoxysilane (OTS) selectively carried out only on the gaps between the electrodes in an arrangement of a large number of source-drain electrodes formed on a substrate.

Moreover, regarding a configuration of a monocrystalline organic semiconductor device using a solution method, Applied Physics Express, vol. 2, p. 111501, 2009 has proposed method comprises steps: contacting an end portion of a silicon wafer or the like for supporting droplets on a substrate with 2,7-dioctyl[1] benzothieno [3,2-b][1] benzothiophene (hereinafter, referred to as "C8-BTBT") with a highly crystalline property; and gradually growing a C8-BTBT monocrystal by tilting the entire substrate.

However, the above methods are insufficient in terms of manufacturing a monocrystalline organic semiconductor thin film with good controllability in an industrially mass producible level. Moreover, regarding the application of a printing technique, in particular, for effectively utilizing property of organic electronics, no effective methods applicable to the monocrystalline organic semiconductor device have been known.

SUMMARY OF THE INVENTION

In view of the above-mentioned circumstances, the first object of the present invention is to provide method for manufacturing an organic semiconductor thin film consisting of single organic molecule by printing method, with extremely few pinholes and of which both quality and thickness are uniform in a predetermined region including a peripheral portion. The second object of the present invention is to manufacture a monocrystalline organic semiconductor thin film of which almost the entire region consists of a single monocrystal by printing process.

The first object of the present invention is solved by the following first means.
(1) A method for manufacturing an organic semiconductor thin film comprising the steps of: preparing a first ink by dissolving a high concentration of an organic semiconductor in an organic solvent having a high affinity for the organic semiconductor and a second ink consisting of an organic solvent having a low affinity for the organic semiconductor; and mixing the first and second inks on a substrate.
(2) The method according to (1), wherein the first and second inks are simultaneously or alternately discharged onto the substrate from respective ink heads.
(3) The method according to (1) or (2), wherein the organic semiconductor is TIPS pentacene.

Moreover, when a highly crystalline organic semiconductor material is formed into a thin film by the first means for solving the above problems, after dropping on a substrate, seed crystals are randomly generated at each of portions of the ink droplets stored thereon, in particular, at each of the peripheral portion of the droplet where the evaporation rate of the solvent is fast. The resultant organic semiconductor thin film is therefore prepared as a polycrystalline organic thin film consisting of several to several hundred pieces of microcrystals. For this reason, it is difficult to obtain a monocrystalline organic semiconductor thin film with the regularity of molecular arrangement on substantially the entire region by printing method. Therefore, the second object of the present invention is to manufacture a monocrystalline organic semiconductor thin film of which substantially the entire region of a thin film is consisting of a single monocrystal by printing method.

The above second object of the present invention is solved by the following second means.
(4) A method for manufacturing a monocrystalline organic semiconductor thin film comprising the steps of: preparing a first ink by dissolving a high concentration of an organic semiconductor in an organic solvent having a high affinity for the organic semiconductor and a second ink consisting of an organic solvent having a low affinity for the organic semiconductor; and mixing the first and second inks on a substrate to form a region storing the ink,
wherein a shape on which a seed crystal is generated with highly efficiency in one portion of the region storing the ink and a monocrystal is grown over the entire region storing the ink from the shape as a starting point.
(5) A method for manufacturing a monocrystalline organic semiconductor thin film comprising the steps of: preparing a first ink by dissolving a high concentration of an organic semiconductor in an organic solvent having a high affinity for the organic semiconductor and a second ink consisting of an organic solvent having a low affinity for the organic semiconductor; and mixing the first and second inks on a substrate to form a region storing the ink,
wherein the region storing the ink is consisting of a small liquid storing portion in which a seed crystal is generated, a large liquid storing portion in which a monocrystal is grown from the seed crystal and a neck portion for suppressing convection between the liquid storing portions and selecting a crystal growing direction.
(6) The method for manufacturing a monocrystalline organic semiconductor thin film according to (4) or (5), wherein the first and second inks are simultaneously or alternately discharged onto the substrate from each ink head.
(7) The method for manufacturing a monocrystalline organic semiconductor thin film according to any one of (4) to (6), wherein the region storing the ink is defined by hydrophilizing a portion of the hydrophobilized substrate surface and further carrying out a lipophilic treatment to a portion of the hydrophilized substrate surface.

Since the first means of the present invention can avoid an aggregated state on a peripheral portion of each droplet caused by simultaneous evaporation and deposition of a solvent, an organic semiconductor layer with uniform quality and film thickness over a 100 μm×100 μm or more can be produced. Therefore, an organic semiconductor device with superior device property can be constructed by printing method without a vacuum process. Moreover, it is applicable to manufacturing process suitable for mass production by inexpensive roll-to-roll operation.

By the second means of the present invention, a seed crystal is firstly generated on a portion of each ink droplet stored on a substrate, and then a monocrystalline organic semiconductor thin film can be grown across substantially the entire region of the droplet from the portion as a core. Therefore, a monocrystalline organic semiconductor layer with a single monocrystal over 100 μm×100 μm or more can be produced. Thus, it becomes possible to construct an organic semiconductor device showing excellent device property without grain boundary causing degradation of device property can be manufactured by printing method. Moreover, it is applicable to a manufacturing process suitable for mass production by inexpensive roll-to-roll operation.

BRIEF DESCRIPTIONS OF THE DRAWINGS

DESCRIPTIONS OF THE PREFERRED EMBODIMENTS

The present invention is described with reference to figures in detail hereinafter.

EXAMPLE 1

This example relates to manufacturing an organic semiconductor thin film. The example using 6,13-bistriisopropylsilylethynyl pentacene (hereinafter, abbreviated as "TIPS pentacene") reported as a material forming an organic semiconductor layer to manufacture an organic thin film transistor is described in Example 1.

Chlorobenzene (CB) was used as a solvent for dissolving TIPS pentacene at a high concentration. N,N-dimethyl formamide (DMF) was prepared as a solvent for hardly dissolving TIPS pentacene. Thus, a TIPS pentacene thin film was manufactured by using an ink jet device with two ink jet heads capable of individually discharging.

Each of Materials, TIPS pentacene, CB and DMF is obtainable at low costs. A Refined TIPS pentacene was applied by re-crystallization method.

First, 36.3 mmol/l of TIPS pentacene solution of which concentration is used as an ink was prepared by dissolving TIPS pentacene (31 mg) (48.5 μmol: molecular weight 639) in 1.3 ml of chlorobenzene (CB) to prepare an ink dissolved at a high concentration of an organic semiconductor. The viscosity of each of the resultant inks was 2 to 3 mPa·s, and the inks indicated a desirable property for use of ink jet printing method.

The ink (Ink A) dissolved the above organic semiconductor in an organic solvent and an ink (Ink B) consisting of an organic solvent hardly dissolving the organic semiconductor were struck in the same position by an ink jet device provided with two ink jet heads and mixed. On the substrate, an organic semiconductor layer, obtained by deposition of the organic semiconductor prior to evaporation of the solvent by mixing Ink A and Ink B, was formed.

Figure 1:
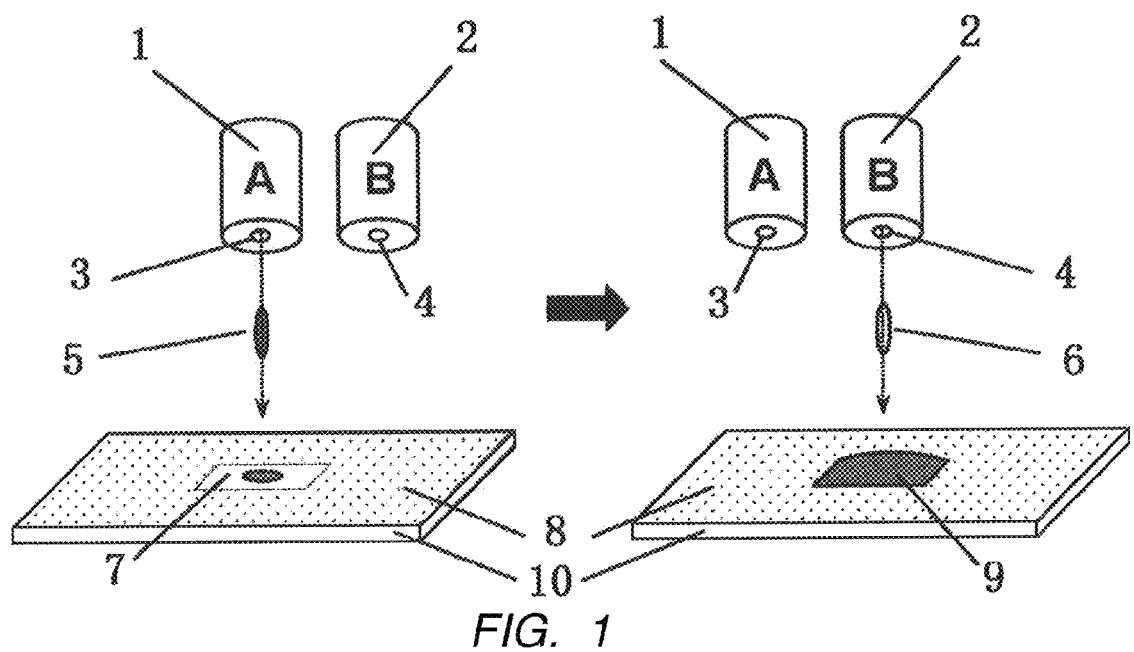
FIG. 1 is a schematic view showing a double shot-ink jet method using two-droplet alternately striking method of the present invention.

The present invention is described based on the following examples in more detail. An application device for the solution used was an ink jet type printing device which can desirably discharge an accurate amount of a micro-droplet with about 100 picoliters at an accurate position by digital control in a non-contact state on each of two kinds of inks, respectively Ink A comprising TIPS pentacene and Ink B consisting of the solvent with low affinity were applied onto the same position on the substrate, respectively and mixed in solution states (see FIG. 1).

Moreover, it is useful to use a substrate on which patterning is applied by a hydrophilic and a hydrophobic treatment to define droplets dropped by the ink jet method within a desired region.

In this example, as a substrate, a p-type silicon wafer coated with a thickness of 100 nm of a silicon oxide film applied a hydrophilic/hydrophobic patterning thereon was used.

The patterning was carried out by hydrophobizing the entire surface of the silicon oxide film by exposuring to gaseous hexamethyl disilazane (HMDS) overnight, and then, selectively hydrophilizing surface portions of substrate of which surface is not masked among the substrate surface by UV/ozone treatment of the surface in a state with a mask pattern pasted together thereon.

Regarding the resultant substrate surface, for example, CB, a contact angle was 2 degrees or less on the hydrophilic surface portion while a contact angle was 35 degrees was on the hydrophobic surface portion. Accordingly, the droplet can be confined inside the hydrophilic pattern.

The ink applying step by ink jet method comprises moving Head 1 filled with Ink A to a position of Hydrophilic-treated substrate surface portion 7 on the surface of Substrate 10, striking Ink A on the substrate by discharging 30 droplets of Ink A from Opening 3, quickly moving Head 2 filled with Ink B to the position where Ink A was struck, discharging 45 droplets of Ink B from Opening 4, and obtaining Droplet 9 mixed Ink A and Ink B on the substrate.

Figure 2A:
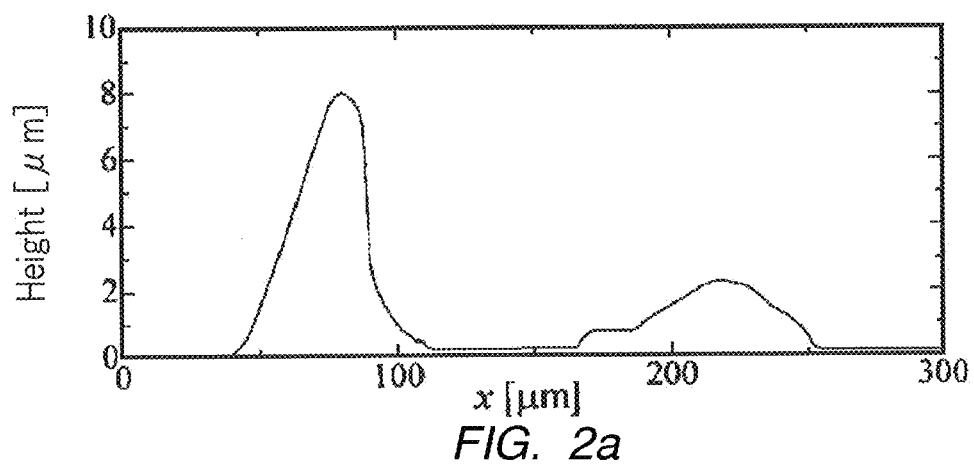
FIG. 2 shows measurement results of a film thickness profile of a monocomponent organic semiconductor thin film formed on a substrate by (a) a conventional single shot method and (b) a double shot method of the present invention.
Figure 2B:
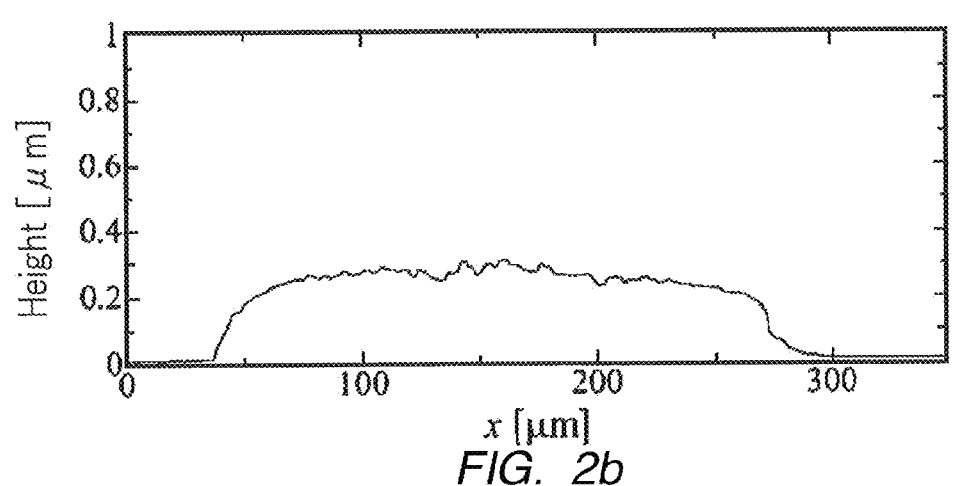

After mixing Ink A and Ink B in a preliminarily formed 200 μm×800 μm of hydrophilic rectangular region, an organic semiconductor layer was first deposited several seconds later, and the next several minutes later, all the solvent was dried by evaporation, and then, an organic semiconductor thin film with a thickness of around 260 nm was formed. As shown in FIG. 2(b), as a film thickness profile was that the film thickness was uniform over the entire region compared with film thickness profile (FIG. 2(a)) obtained by droplet-striking and dring by single shot method using Ink A without Ink B FIG. 3 shows a polarizing microscope photograph of a monocomponent organic semiconductor thin film formed on a substrate by conventional single shot method (a) and double shot method (b, c). The photographs (b) and (c) were observed the same thin film by different polarizing angles, respectively, based upon an orthogonal Nichols chart.

Figure 3C:
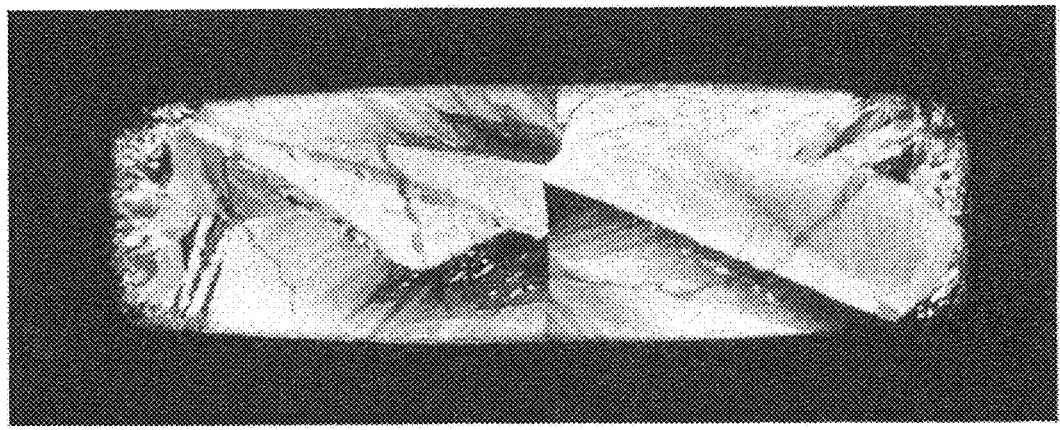
FIG. 3 shows polarizing microscope photographs of a monocomponent organic semiconductor thin film formed on a substrate by (a) a conventional single shot method and (b) a double shot method of the present invention.
Figure 3B:
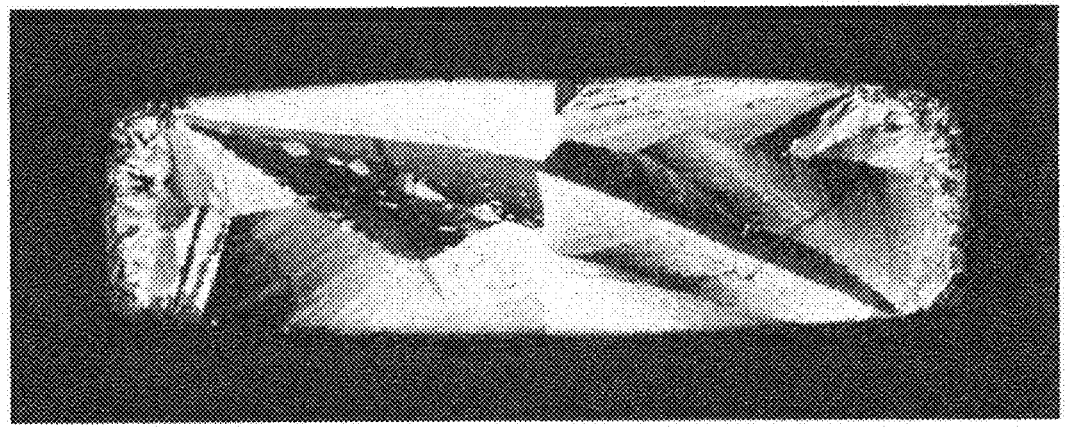
Figure 3A:
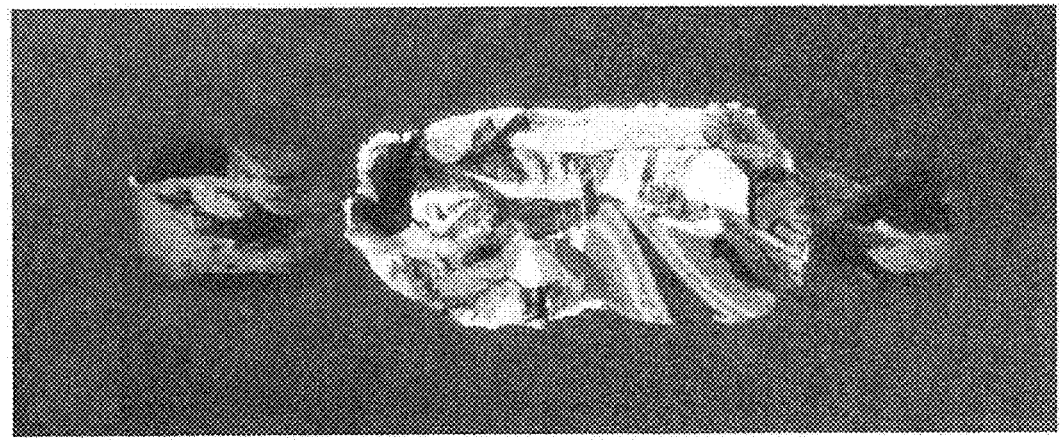

FIGS. 3(b) and 3(c) indicate by the double shot method of the present invention that a highly crystalline organic semiconductor thin film was obtained.

The above examples are utilized to facilitate understanding of the present invention, and therefore the present invention is not intended to be limited by the examples. The present invention obviously includes any modifications and any embodiments based on technical ideas of the present invention.

For example, as an organic semiconductor, results obtained using TIPS pentacene are exemplified; however, any organic semiconductors showing high dissolving property to a certain organic solvent but hardly any dissolving property to any organic solvents may be used. Organic molecules of which solubility to a certain organic solvent is selectively improved by substitution of an alkyl group or a substituent equivalent thereto may be used.

Though CB was exemplified as a solvent of high affinity for the organic semiconductor and DMF was exemplified as a solvent of low affinity thereto, any solvents showing excellent solubility to organic low molecules may be used. The same effects can be obtained as long as being mixed without separation.

For example, an ink jet device was exemplified as an applying device for the solution; however, the two liquids may be applied using a dispenser.

In the above example, though Ink B was dropped after dropping Ink A, the same effects can be obtained in any of cases that Ink A is dropped after dropping Ink B and that both are simultaneously dropped.

EXAMPLE 2

This example relates to manufacturing a monocrystalline organic semiconductor thin film. In this case, C8-BTBT with high crystalline property was used as an organic material constituting an organic semiconductor layer. An organic semiconductor layer was formed using an ink formed by dissolving dissolving a high concentration of the above organic semiconductor and an ink of an organic solvent hardly dissolving the organic semiconductor by the double shot-ink jet printing method explained in example 1.

A region stored an ink dropped on a substrate by the ink jet printing method was defined by patterning by both hydrophilic (lipophilic) and hydrophobic treatments on the substrate surface. The region is surface-treated so that it has preliminarily designed shape to relatively quickly evaporate the solvent at a certain portion and to generate a seed crystal to form a monocrystalline organic semiconductor thin film.

The present invention will explain based upon the following example in more detail.

As inks used for the double shot-ink jet printing, 26.9 mmol/l of an ink (Ink A) was prepared by dissolving C8-BTBT (10 mg) (21.5 µmol: molecular weight 464.77) in ortho-dichlorobenzene (DCB) (0.8 ml) and an ink (Ink B) consisting of dimethyl formamide which hardly dissolve C8-BTBT. DCB and DMF used as a material are available at a low cost. The viscosity of the resultant inks was 2 to 3 mPa·s and indicated a desirable property for an ink used in ink jet printing method.

The used ink jet type printing device can optionally discharge the precise amount of around 100 picoliters of a microdroplet at an accurate position by digital control in a non-contact state. Ink A containing C8-BTBT and Ink B consisting of the solvent with a low affinity thereto were applied onto the same position on the substrate, respectively, and mixed in solution state.

In this example, a p-type silicon wafer coated with a silicon oxide film having a thickness of 100 nm was used as a substrate, and a gold electrode for a source-drain electrode was formed thereon. As treatment method for the substrate surface, hydrophobic treatment on an insulating film surface was carried out with hexamethyl disilazane (HMDS), and hydrophobic treatment on the gold electrode surface was carried out by thiol treatment. To form a hydrophilic (lipophilic) region after the hydrophobic treatment, one portion of the substrate surface was exposed by a mask pattern having a shape shown in FIG. 4(a), and selectively hydrophilized by UV/ozone treatment. Subsequently, the hydrophilic surface was treated by lipophilic phenethyl trichlorosilane (PTS). Thus, a surface treated pattern enabling the ink droplets dropped the substrate to be confined within a lipophilic region having a shape shown in FIG. 4(a) was obtained.

The ink applying process by the ink jet method comprises, first, moving a head filled with the Ink B to the lipophilic region, striking Ink B on the substrate by discharging 40 droplets of the Ink B, moving a head filled with Ink A to the position which Ink B was struck, discharging 12 droplets of Ink A, and obtaining a droplet mixed Inks A and B on the substrate.

Figure 4D:
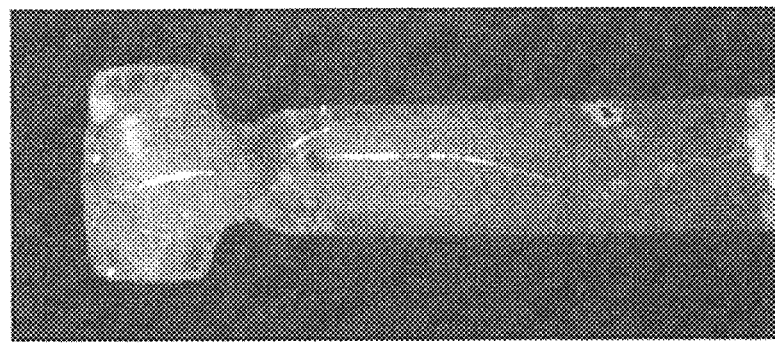
FIG. 4 shows (a) an example of a hydrophilic (lipophilic)/hydrophobic patterning for forming a monocrystalline organic semiconductor thin film, (b) a generation position of a seed crystal (indicated by a black round mark) and a growing direction (indicated by an arrow) of a monocrystal, and (c, d) polarizing microscope photographs of monocrystal thin films obtained by C8-BTBT in example 2.
Figure 4C:
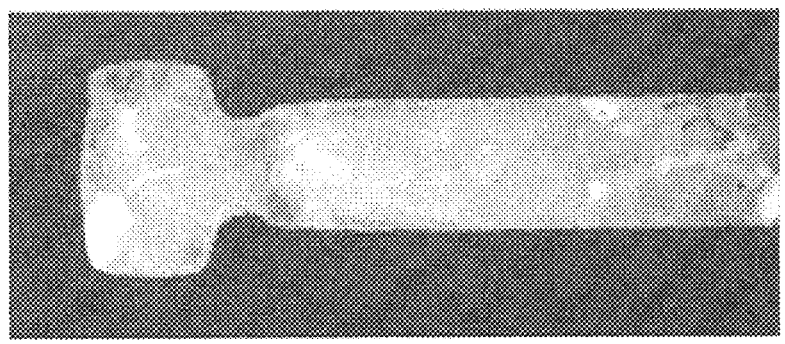
Figure 4B:
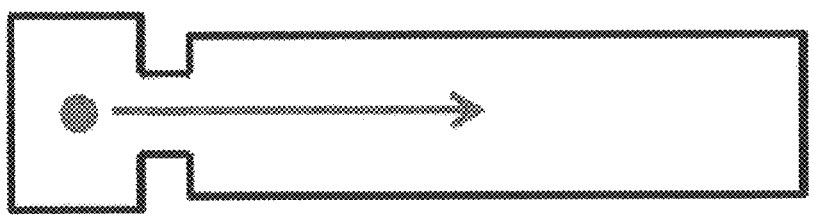
Figure 4A:
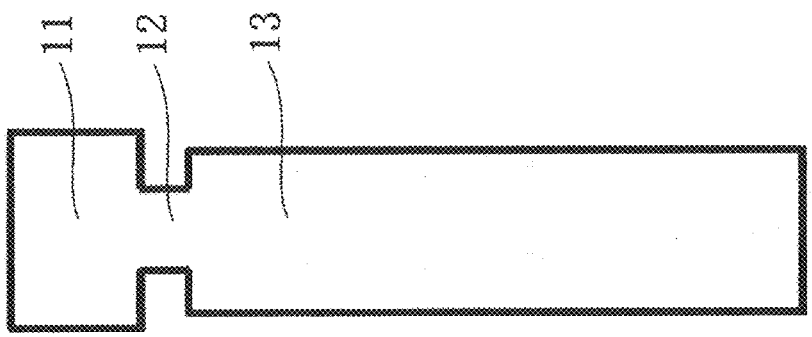
Figure 5A:
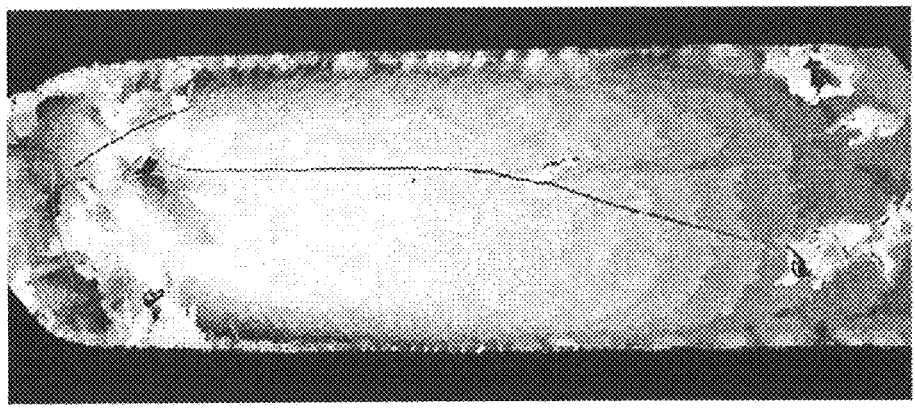
FIG. 5 shows (a) a microscope photograph of a C8-BTBT monocrystal thin film, (b) an atomic force microscope image of a thin film surface, (c) a height profile, and (d) a crystal structure of a C8-BTBT monocrystal.
Figure 5B:
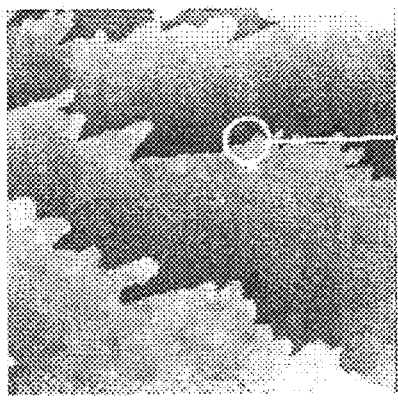
Figure 5C:
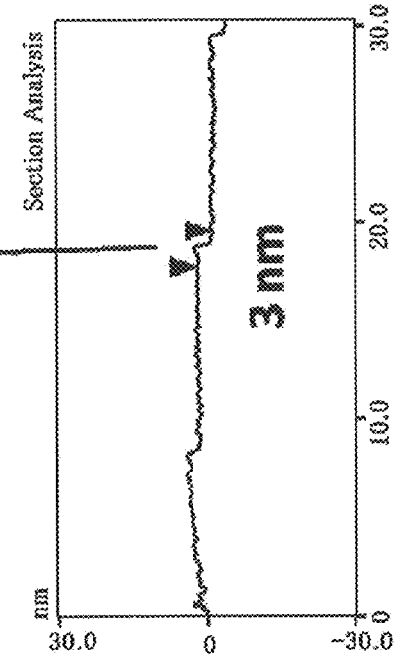
Figure 5D:
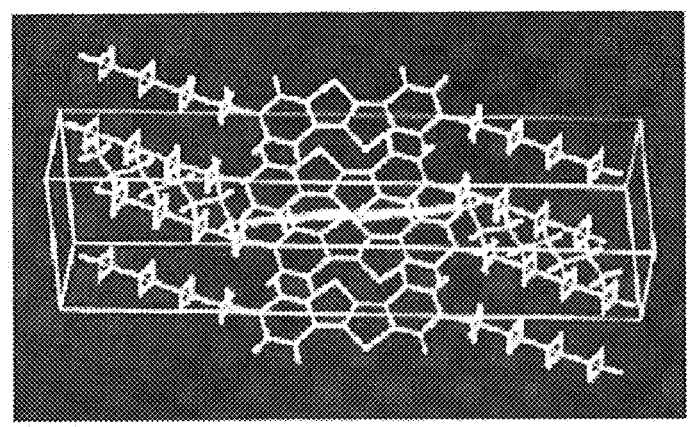

The shape of lipophilic region shown in FIG. 4(a) is composed of Small liquid storing portion 11, Large liquid storing portion 13 and Neck portion 12 for suppressing convection between portions 11 and 13. The volume of a droplet stored in Small liquid storing portion 11 per unit surface area is smaller than that stored in Large liquid storing portion 13 due to a limitation of contact angle. Since the convection between two portions 11 and 13 is limited to some extent, the solvent is evaporated with high efficiency per unit volume in Small liquid storing portion 11 of which the ratio of surface area to volume is large and seed crystals are generated. The seed crystals of which growing directions of the polycrystalline are homologous through the neck portion 12 are selected among the seed crystals generated in Liquid storing portion 11 and form a core of crystal growth in the liquid storing portion 13. As shown in FIG. 4(b), a monocrystal is grown from the core as a starting point.

The crystal growth was observed with a microscope and it was observed that seed crystals generated in the small liquid storing portion formed cores and a monocrystal had gradually grown in a direction from the portion 11 to the portion 13, in the large liquid storing portion. FIG. 4(c) is a polarizing microscope photograph of C8-BTBT obtained.

FIG. 5 shows experimental results indicating that the resultant thin film is a monocrystalline thin film. FIG. 5(a) is an enlarged view of a microscopic photograph indicating that a stripe pattern is observed. FIG. 5(b) shows the results of observation of the stripe pattern by an atomic force microscopic image, and FIG. 5(c) shows the results of a height profile examination thereof. These indicate that the stripe pattern observed in the microscopic photograph caught the change of 3 nm thickness. This thickness change is consistent with the thickness of a molecular layer derived from C8-BTBT shown in FIG. 5(d) and it is concluded that a step-and-terrace structure in a single crystal is observed.

The above examples are utilized to facilitate understanding of the present invention, and therefore the present invention is not intended to be limited by the examples. The present invention obviously includes any modifications and any embodiments based on technical ideas of the present invention.

For example, as an organic semiconductor, results obtained using C8-BTBT are exemplified; however, any organic semiconductors showing high crystalline property may be used. Organic molecules with high crystalline property in layer by substitution of an alkyl group or a substituent equivalent thereto may be used.

As method for forming an organic semiconductor layer with highly uniformity, a double shot-ink jet method mixing two different kinds of droplets is exemplified; however, any methods for forming an organic semiconductor layer with highly uniformity may be used. Same effects can be obtained as long as a seed crystal is efficiently generated from one portion of a droplet dropped on a substrate.

For example, the same effects can be obtained when a monocrystalline organic semiconductor is grown up by gradually evaporating an organic solvent by tilting a substrate in solution method.

While the present invention has been illustrated and described with respect to a particular embodiment thereof, it should be appreciated by those of ordinary skill in the art that various modifications to this invention may be made without departing from the spirit and scope of the present invention.

What is claimed is:

1. A method for manufacturing an organic semiconductor thin film comprising the steps of:
preparing a first ink by dissolving a concentration of an organic semiconductor in an organic solvent comprising chlorobenzene (CB) or ortho-dichlorobenzene (DCB) and a second ink of comprising an organic solvent comprising N,N-dimethyl formamide (DMF); and
mixing the first and second inks on a substrate.

2. The method according to claim 1, wherein the first and second inks are simultaneously or alternately discharged onto the substrate from respective ink heads.

3. The method according to claim 1, wherein the organic semiconductor is TIPS pentacene.

4. A method for manufacturing a monocrystalline organic semiconductor thin film comprising the steps of: preparing a first ink by dissolving a concentration of an organic semiconductor in an organic solvent comprising chlorobenzene (CB) or ortho-dichlorobenzene (DCB) and a second ink comprising an organic solvent comprising N,N-dimethyl formamide (DMF); and mixing the first and second inks on a substrate to form a region storing the ink,
wherein a shape on which a seed crystal is generated in one portion of the region storing the ink and a monocrystal is grown over the entire region storing the ink from the shape as a starting point.

5. The method for manufacturing a monocrystalline organic semiconductor thin film according to claim 4, wherein the first and second inks are simultaneously or alternately discharged onto the substrate from each ink head.

6. The method for manufacturing a monocrystalline organic semiconductor thin film according to claim 4, wherein the region storing the ink is defined by hydrophilizing a portion of the hydrophobilized substrate surface and further carrying out a lipophilic treatment to a portion of the hydrophilized substrate surface.

7. A method for manufacturing a monocrystalline organic semiconductor thin film comprising the steps of: preparing a first ink by dissolving a concentration of an organic semiconductor in an organic solvent comprising chlorobenzene (CB) or ortho-dichlorobenzene (DCB) and a second ink comprising an organic solvent comprising N,N-dimethyl formamide (DMF); and mixing the first and second inks on a substrate to form a region storing the ink,
wherein the region storing the ink comprises a small liquid storing portion in which a seed crystal is generated, a large liquid storing portion in which a monocrystal is grown from the seed crystal and a neck portion for suppressing convection between the liquid storing portions and selecting a crystal growing direction.

8. The method for manufacturing a monocrystalline organic semiconductor thin film according to claim 7, wherein the first and second inks are simultaneously or alternately discharged onto the substrate from each ink head.

9. The method for manufacturing a monocrystalline organic semiconductor thin film according to claim 7, wherein the region storing the ink is defined by hydrophilizing a portion of the hydrophobilized substrate surface and further carrying out a lipophilic treatment to a portion of the hydrophilized substrate surface.

* * * * *